(12) United States Patent
Lee et al.

(10) Patent No.: US 10,777,679 B2
(45) Date of Patent: Sep. 15, 2020

(54) REMOVAL OF WORK FUNCTION METAL WING TO IMPROVE DEVICE YIELD IN VERTICAL FETS

(71) Applicant: International Business Machines Corporation, Armonk, NY (US)

(72) Inventors: Choonghyun Lee, Rensselaer, NY (US); Soon-Cheon Seo, Glenmont, NY (US); Injo Ok, Loudonville, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/255,391

(22) Filed: Jan. 23, 2019

(65) Prior Publication Data

US 2020/0235238 A1 Jul. 23, 2020

(51) Int. Cl.
*H01L 29/78* (2006.01)
*H01L 29/66* (2006.01)
*H01L 29/423* (2006.01)

(52) U.S. Cl.
CPC .... *H01L 29/7827* (2013.01); *H01L 29/42356* (2013.01); *H01L 29/42376* (2013.01); *H01L 29/6656* (2013.01); *H01L 29/66666* (2013.01)

(58) Field of Classification Search
CPC ......... H01L 29/42356–4236; H01L 29/42376; H01L 29/66666; H01L 29/7827
See application file for complete search history.

(56) References Cited

U.S. PATENT DOCUMENTS 9,530,866 B1 * 12/2016 Zhang ................. H01L 29/0676
9,590,073 B2    3/2017 Ryu et al.
9,978,850 B2    5/2018 Chuang et al.
10,032,890 B2   7/2018 Yim et al.
2017/0069757 A1 3/2017 Peng et al.
2017/0179123 A1 6/2017 Chang et al.
2018/0033866 A1 2/2018 Liao et al.
2018/0261514 A1 9/2018 Xie et al.

FOREIGN PATENT DOCUMENTS

WO    2009153712 A1   12/2009

OTHER PUBLICATIONS

Masahara, M., "Advanced FinFET Process Technology", WIMNACT Workshop and IEEE EDS Mini-colloquium on Nanometer CMOS Technology 31, Jan. 30, 2012, 25 pages, https://www.ieee-jp.org/section/tokyo/chapter/ED-15/2012/EDS-MQ_Jan-2012.htm; https://www.ieee-jp.org/section/tokyo/chapter/ED-15/2012/WIMNACT%2031%20presentation/WIMNACT%2031%.

* cited by examiner

*Primary Examiner* — Daniel P Shook
(74) *Attorney, Agent, or Firm* — Scully, Scott, Murphy & Presser, P.C.; L. Jeffrey Kelly, Esq.

(57) ABSTRACT

A vertical transistor that includes a gate structure containing a work function metal liner that is wing-free is provided. The wing-free work function metal liner is provided by recessing a sacrificial material layer portion that is located adjacent to a work function metal liner having a winged surface near the channel and fin ends. The recessed sacrificial material layer portion allows for multi-directional etching of the winged surface of the work function metal liner and thus the wing surface can be removed forming a wing-free work function metal liner. The vertical transistor of the present application has reduced parasitic capacitance and a reduced tendency of electrical shorting between a top source/drain structure and the gate structure. The method of the present application can improve device yield.

20 Claims, 7 Drawing Sheets

REMOVAL OF WORK FUNCTION METAL WING TO IMPROVE DEVICE YIELD IN VERTICAL FETS

BACKGROUND

The present application relates to a semiconductor structure and a method of forming the same. More particularly, the present application relates to a vertical transistor including a gate structure containing a work function metal liner that is wing-free, and a method of forming the same.

Conventional vertical transistors are devices where the source-drain current flows in a direction normal to the substrate surface. In such devices, a vertical semiconductor pillar (or fin) defines the channel with the source and drain located at opposing ends of the semiconductor pillar. Vertical transistors are an attractive option for technology scaling for beyond 7 nm technologies.

In a conventional vertical transistor processing flow, a gate dielectric material layer and a work function metal layer are recessed to a certain level of the semiconductor fin to define the channel length. However, due to the confined geometry of the gate structure, the outer work function metal layer is under etched (i.e., the work function metal layer has less exposure to the wet chemical at the edge). This under etch results in a non-uniform work function metal liner having a winged surface. The work function metal liner having the winged surface causes degradation of device yield as well as a parasitic capacitance between the gate structure and the top source/drain structure. There is thus a need for providing a vertical transistor that includes a gate structure containing a work function metal liner that is wing-free.

SUMMARY

A vertical transistor that includes a gate structure containing a work function metal liner that is wing-free is provided. The wing-free work function metal liner is provided by recessing a sacrificial material layer portion that is located adjacent to a work function metal liner having a winged surface near the channel and fin ends. The recessed sacrificial material layer portion allows for multi-directional etching of the winged surface of the work function metal liner and thus the wing surface can be removed forming a wing-free work function metal liner. The vertical transistor of the present application has reduced parasitic capacitance and a reduced tendency of electrical shorting between a top source/drain structure and the gate structure. The method of the present application can improve device yield.

In one aspect of the present application, a vertical transistor is provided. In one embodiment, the vertical transistor includes a semiconductor fin located on a mesa portion of a semiconductor substrate. A bottom source/drain structure contacts a sidewall of the mesa portion of the semiconductor structure. A gate structure is located adjacent to a sidewall of the semiconductor fin and spaced apart from the bottom source/drain structure. The gate structure includes a gate dielectric material liner and a wing-free work function metal liner. A sacrificial material liner is located on the wing-free work function metal liner. A top source/drain structure is spaced apart from the gate structure and contacts an upper portion of the sidewall of semiconductor fin and a topmost surface of the semiconductor fin.

In another aspect of the present application, a method of forming a vertical transistor is provided. In one embodiment, the method includes forming a semiconductor fin on a mesa portion of a semiconductor substrate, wherein a bottom source/drain structure extends from a sidewall of the mesa portion of the semiconductor structure and a bottom spacer is located on the bottom source/drain structure and contacting a lower portion of a sidewall of the semiconductor fin. A gate stack is then formed on the bottom spacer and laterally adjacent to and above the semiconductor fin, wherein the gate stack includes a gate dielectric material layer and a work function metal layer. Next, a sacrificial material layer is formed on the work function metal layer, and a passivation material layer is formed on the sacrificial material layer. A horizontal portion of each of the passivation material layer and the sacrificial material layer located above the semiconductor fin are removed to physically expose a horizontal surface of the work function metal layer. The work function metal layer is then recessed to provide a work function metal liner having a winged surface. Next, the gate dielectric material layer is recessed to provide a gate dielectric material liner and thereafter, a remaining portion of the sacrificial material layer is recessed to provide a sacrificial material liner. The winged surface of the work function metal liner is then removed to provide a wing-free work function metal liner. Next, a top spacer is formed on a topmost surface of each of the gate dielectric material liner, the wing-free work function metal liner, and the sacrificial material liner, and thereafter a top source/drain structure is formed on the top spacer and contacting an upper portion of the sidewall of the semiconductor fin and a topmost surface of the semiconductor fin.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
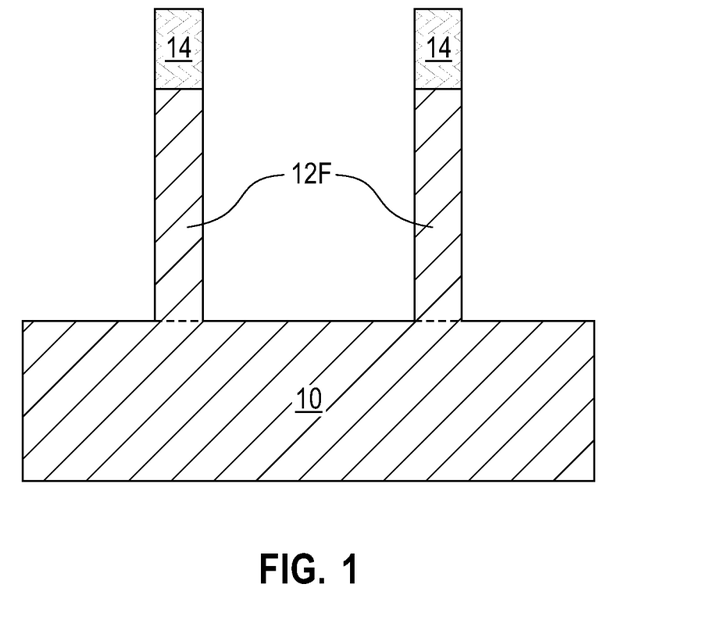
FIG. 1 is a cross sectional view of an exemplary vertical transistor of the present application and during an early stage of fabrication, the exemplary vertical transistor including a plurality of semiconductor fins extending upward from a surface of a semiconductor substrate, each semiconductor fin is capped with a dielectric hard mask cap.

Referring first to FIG. 1, there is illustrated an exemplary semiconductor structure including a plurality of semiconductor fins 12F (or semiconductor pillars) extending upward from a surface of a semiconductor substrate 10. Each semiconductor fin 12F is capped with a dielectric hard mask cap 14. Although FIG. 1 illustrates two semiconductor fins, the present application works when a single semiconductor fin is formed, or when more than two semiconductor fins are formed.

As used herein, a "semiconductor fin" refers to a semiconductor material portion that includes a pair of vertical sidewalls that are parallel to each other. As used herein, a surface is "vertical" if there exists a vertical plane from which the surface does not deviate by more than three times the root mean square roughness of the surface. In one embodiment, each semiconductor fin 12F has a height from 20 nm to 200 nm, and a width from 5 nm to 30 nm. Other heights and/or widths that are lesser than, or greater than, the ranges mentioned herein can also be used in the present application. Each semiconductor fin 12F is spaced apart from its nearest neighboring semiconductor fin 12F by a pitch of from 20 nm to 100 nm; the pitch is measured from one point of one semiconductor fin to the exact point on a neighboring semiconductor fin. Also, each semiconductor fin 12F is oriented parallel to each other. A trench is located present between each neighboring pair of semiconductor fins 12F.

The semiconductor substrate 10 may be composed of a remaining portion of a base semiconductor substrate (not shown). The semiconductor substrate 10 may be composed of one or more semiconductor materials having semiconductor properties. Examples of semiconductor materials that may provide the semiconductor substrate 10 include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

Each semiconductor fin 12F may be composed of one of the semiconductor materials mentioned above for the semiconductor substrate 10. In one embodiment, the semiconductor fins 12F and the semiconductor substrate 10 are composed entirely of a same semiconductor material. In such an embodiment, no material interface is present between the semiconductor fins 12F and the semiconductor substrate 10. In one example, the semiconductor fins 12F and the semiconductor substrate 10 are composed entirely of silicon. In another embodiment, the semiconductor fins 12F are composed of a different semiconductor material than the semiconductor substrate 10. In such an embodiment, a material interface would exist between the bottommost surface of each semiconductor fin 12F and the topmost surface of the semiconductor substrate 10. In one example, the semiconductor fins 12F are composed of a silicon germanium alloy or a III-V compound semiconductor, while the semiconductor substrate 10 is composed of silicon. In the drawings of the present application, the dotted horizontal line denotes the position of a possible material interface between each semiconductor fin 12F and the semiconductor substrate 10.

Each dielectric hard mask cap 14 is composed of a dielectric hard mask material such as, for example, silicon dioxide, silicon nitride and/or silicon oxynitride. In one example, silicon nitride is employed as the dielectric hard mask material of each dielectric hard mask cap 14. As is shown, the dielectric hard mask cap 14 has sidewall surfaces that are vertically aligned to sidewall surfaces of the underlying semiconductor fin 12F.

The exemplary semiconductor structure can be formed by first providing a dielectric hard mask layer (not shown) onto a surface of a base semiconductor substrate (not shown). The base semiconductor substrate is typically a bulk semiconductor substrate. By "bulk" it is meant that the base semiconductor substrate is entirely composed of at least one semiconductor material having semiconducting properties. The base semiconductor substrate may include at least one of the semiconductor materials mentioned above for semiconductor substrate 10, and the hard mask layer may include one of the dielectric hard mask materials mentioned above for the hard mask caps 14.

The dielectric hard mask layer may be formed utilizing a deposition process such as, for example, chemical vapor deposition (CVD) or plasma enhanced chemical vapor deposition (PECVD). In some embodiments, the hard mask layer may be formed by a thermal growth process such as, for example, thermal oxidation and/or thermal nitridation. In yet other embodiments, the dielectric hard mask layer may be formed utilizing a combination of, and in any order, a deposition process and a thermal growth process. The dielectric hard mask layer is a continuous layer (without any breaks or gaps) whose thickness may be from 20 nm to 100 nm. Other thicknesses that are lesser than, or greater than the aforementioned thicknesses values may also be employed as the thickness of the dielectric hard mask layer.

The dielectric hard mask layer and an upper semiconductor material portion of the base semiconductor substrate are then patterned to provide the exemplary semiconductor structure shown in FIG. 1. In one embodiment, the patterning of the dielectric hard mask layer and the upper semiconductor material portion of the base semiconductor substrate may include lithography and etching. The lithographic process includes forming a photoresist (not shown) atop a material or material stack to be patterned, exposing the photoresist to a desired pattern of radiation, and developing the exposed photoresist utilizing a conventional resist developer. The photoresist may be a positive-tone photoresist, a negative-tone photoresist or a hybrid-tone photoresist. The etching process (i.e., pattern transfer etch) includes a dry etching process (such as, for example, reactive ion etching, ion beam etching, plasma etching or laser ablation), and/or a wet chemical etching process. In some embodiments, the patterned photoresist is removed from the structure immediately after the pattern has been transferred into the dielectric hard mask layer. In other embodiments, the patterned photoresist is removed from the structure after the pattern has been transferred into both the dielectric hard mask layer and the upper semiconductor material portion of the base semiconductor substrate. In either embodiment, the patterned photoresist may be removed utilizing a conventional photoresist stripping process such as, for example, ashing.

In another embodiment, the patterning of the dielectric hard mask layer and the upper semiconductor material portion of the base semiconductor substrate may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer (not shown) on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet a further embodiment, the patterning of the dielectric hard mask layer and the upper semiconductor material portion of the base semiconductor substrate may include a direct self-assembly (DSA) process in which a copolymer that is capable of direct self-assembly is used. Other well known patterning process can also be used in forming the semiconductor fins 12F.

Figure 2:
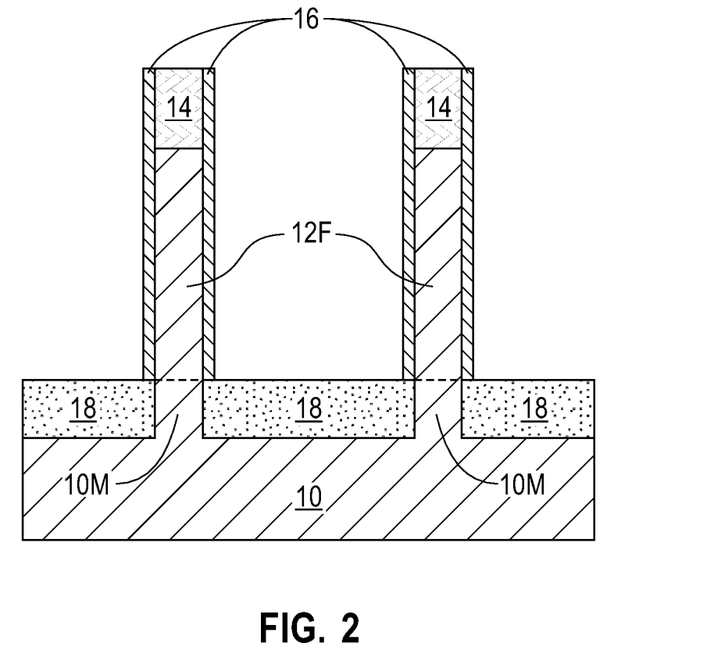
FIG. 2 is a cross sectional view of the exemplary vertical transistor of FIG. 1 after forming a bottom source/drain structure.

Referring now to FIG. 2, there is illustrated the exemplary vertical transistor of FIG. 1 after forming a bottom source/drain structure 18. As is shown, the bottom source/drain structure 18 is located on each side of the semiconductor fin 12F and contacts a mesa portion 10M of the semiconductor substrate 10 that is located directly beneath the semiconductor fin 12F. The mesa portion 10M of the semiconductor substrate 10 forms a bottom source/drain extension region of the vertical transistor of the present application.

Prior to forming the bottom/source drain structure 18, a semiconductor fin liner 16 is formed on physically exposed sidewalls of each dielectric hard mask capped semiconductor fin (14/12F). The semiconductor fin liner 16 is composed of a dielectric material such as, for example, silicon dioxide, silicon nitride, or silicon oxynitride. In some embodiments, the dielectric material that provides the semiconductor fin liner 16 is compositionally different from the dielectric hard mask material that provides each hard mask cap 14. In other embodiments, the dielectric material that provides the semiconductor fin liner 16 is compositionally the same as the dielectric hard mask material that provides each hard mask cap 14.

The semiconductor fin liner 16 may be formed by depositing a dielectric material and then subjecting the dielectric material to an anisotropic etch such as, for example, reactive ion etching, that is selective in removing the dielectric material that provides the semiconductor substrate fin liner 16 from all horizontal surfaces of the exemplary structure shown in FIG. 1. When the semiconductor fin liner 16 and the dielectric hard mask cap 14 are composed of a compositionally same dielectric material, then an upper portion of the dielectric hard mask cap 14 may be removed during the anisotropic etch employed in forming the semiconductor fin liner 16. The dielectric material that provides the semiconductor fin liner 16 may be deposited by, for example, chemical vapor deposition (CVD) or plasma enhanced chemical vapor deposition (PECVD). The semiconductor fin liner 16 may have a width, as measured from one sidewall to an opposing sidewall, from 2 nm to 10 nm; although other widths are possible and are not excluded from being used as width of the semiconductor fin liner 16.

In one embodiment, the bottom source/drain structure 18 may be formed by recessing the physically exposed semiconductor substrate 10 that is located in the trench and between each of the dielectric hard masked capped semiconductor fins (14/12F) utilizing an anisotropic etching process that is selective in removing a semiconductor material relative to a dielectric material; no removal of the semiconductor fins 12F occurs since each semiconductor fin 12F is protected by one of dielectric hard mask caps 14 and the semiconductor fin liners 16.

A bottom source/drain structure 18 is then formed into each bottom source/drain trench that is formed. The bottom source/drain structure 18 is composed of a semiconductor material and an n-type dopant or a p-type dopant. The semiconductor material that provides the bottom source/drain structure 18 may be compositionally the same as, or compositionally different from, the semiconductor material of semiconductor substrate 10 and/or the semiconductor fins 12F. The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. The concentration of dopant (i.e., n-type or p-type) within the semiconductor material that provides the bottom source/drain structure 18 can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{18}$ atoms/cm$^3$ are also conceived.

In this embodiment in which a bottom source/drain trench is formed, the bottom source/drain structure 18 can be formed utilizing an epitaxial growth (or deposition) process.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. In the present application, the bottom source/drain structure 18 has an epitaxial relationship with the physically exposed surface of the semiconductor substrate 10.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The epitaxial growth may be performed at a temperature of from 300° C. to 800° C. The epitaxial growth can be performed utilizing any well known precursor gas or gas mixture. Carrier gases like hydrogen, nitrogen, helium and argon can be used. A dopant (n-type or p-type, as defined above) is typically added to the precursor gas or gas mixture.

In other embodiment, the bottom source/drain structure may be formed by introducing an n-type dopant, as defined above, or a p-type dopant, as defined above, into the physically exposed semiconductor substrate 10 that is located in the trench and between each of the dielectric hard masked capped semiconductor fins (14/12F). In one example, the n-type dopant or the p-type dopant can be introduced into the physically exposed semiconductor substrate 10 that is located in the trench and between each of the dielectric hard masked capped semiconductor fins (14/12F) utilizing ion implantation. In another example, the n-type dopant or the p-type dopant can be introduced into the physically exposed semiconductor substrate 10 that is located in the trench and between each of the dielectric hard masked capped semiconductor fins (14/12F) utilizing gas phase doping. The bottom source/drain structure 18 formed in this embodiment is composed of a same semiconductor material as the semiconductor substrate 10. The n-type dopant or p-type dopant is introduced into the physically exposed semiconductor substrate 10 that is located between each of the dielectric hard masked capped semiconductor fins (14/12F) such that the resultant bottom source/drain structure 18 has a dopant concentration as defined above in the previous embodiment of forming the bottom source/drain structure 18.

After forming the bottom source/drain structure 18, the semiconductor fin liners 16 are removed from each semiconductor fin 12F utilizing an etching process that is selective in removing the semiconductor fin liners 16 from the exemplary structure shown in FIG. 2. A portion of each dielectric hard mask 14 may or may not be removed during the semiconductor fin liner 16 removal.

Figure 3:
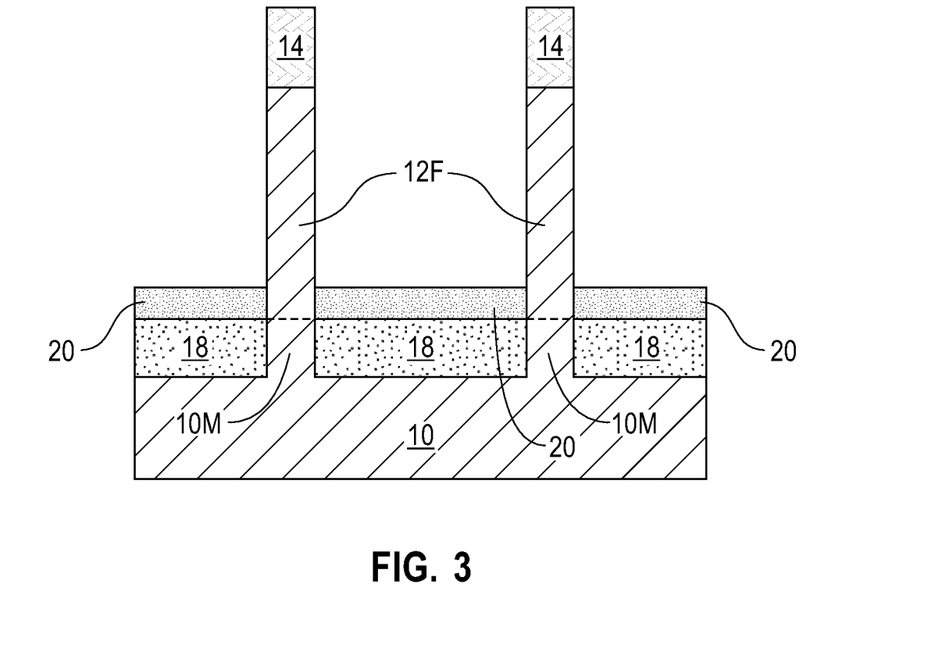
FIG. 3 is a cross sectional view of the exemplary vertical transistor of FIG. 2 after forming a bottom spacer on the bottom source/drain structure.

Referring now to FIG. 3, there is illustrated the exemplary vertical transistor of FIG. 2 after forming a bottom spacer 20 on the bottom source/drain structure 18. The bottom spacer 20 has a sidewall that directly contacts a lower portion of a sidewall of at least one the semiconductor fins 12F. The bottom spacer 20 may be composed of any dielectric spacer material including, for example, silicon dioxide, silicon nitride, or silicon oxynitride. The dielectric spacer material that provides the bottom spacer 20 may be composed of a low k dielectric material (i.e., a dielectric material having a dielectric constant that is less than the dielectric constant of 4.0, all dielectric constants mentioned herein as measured in a vacuum). An example of a low k dielectric material that can be used as the bottom spacer 20 includes a dielectric material including atoms of silicon, boron, carbon and nitrogen.

The bottom spacer 20 may be formed utilizing a deposition process such as, for example, chemical vapor deposition or plasma enhanced chemical vapor deposition. In some instances, an etch back process may follow the deposition of the dielectric spacer material that provides the bottom spacer 20. The bottom spacer 20 may have a thickness from 5 nm to 15 nm. Other thicknesses that are lesser than, or greater than, the aforementioned thickness range may also be employed in the present application as the thickness of the bottom spacer 20 as long as the height of the bottom spacer 20 is not greater than the height of the semiconductor fins 12F and there is sufficient area on each of the semiconductor fins 12F to form the other components of the vertical transistor.

Figure 4:
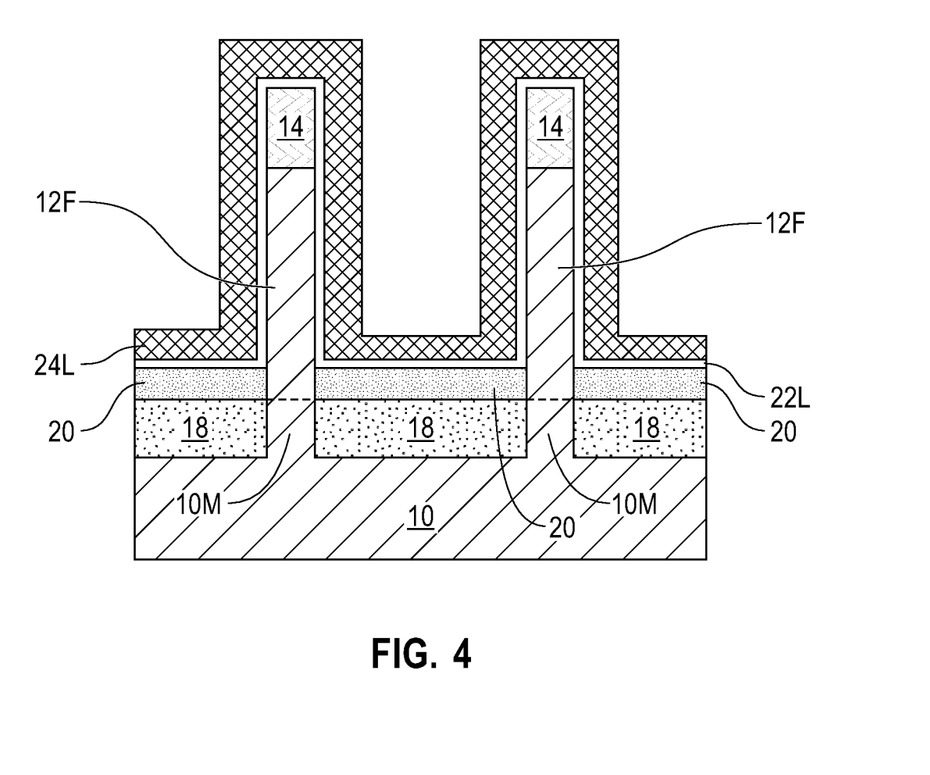
FIG. 4 is a cross sectional view of the exemplary vertical transistor of FIG. 3 after forming a gate dielectric material layer and a work function metal layer.

Referring now to FIG. 4, there is illustrated the exemplary vertical transistor of FIG. 3 after forming a gate dielectric material layer 22L and a work function metal layer 24L. The gate dielectric material layer 22L and the work function metal layer 24L are continuous layers that are formed in the trench that is located between each dielectric hard mask capped semiconductor fin (14/12F) and atop each dielectric hard mask capped semiconductor fin (14/12F). As is shown, the gate dielectric material layer 22L is formed prior to the work function metal layer 24L, and a portion of the gate dielectric material layer 22L directly contacts a physically exposed sidewall of the semiconductor fins 12F. In the present application, the work function metal layer 24L is employed as the sole gate material of the gate structure.

The gate dielectric material layer 22L may be composed of a gate dielectric material such as, for example, an oxide, nitride, and/or oxynitride. In one example, the gate dielectric material layer 22L can be a high k material having a dielectric constant greater than 4.0. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as gate dielectric material layer 22L.

The gate dielectric material that provides the gate dielectric material layer 22L can be formed by any deposition process including, for example, chemical vapor deposition (CVD), plasma enhanced chemical vapor deposition (PECVD), physical vapor deposition (PVD), sputtering, or atomic layer deposition (ALD). In one embodiment of the present application, the gate dielectric material that provides the gate dielectric material layer 22L can have a thickness in a range from 1 nm to 10 nm. Other thicknesses that are lesser than, or greater than, the aforementioned thickness range can also be employed for the gate dielectric material that provides the gate dielectric material layer 22L. In some embodiments, the gate dielectric material layer 22L has a conformal thickness. The term "conformal" denotes that a material layer has a vertical thickness along horizontal surfaces that is substantially the same (i.e., within ±5%) as the lateral thickness along vertical surfaces.

The work function metal layer 24L is formed on the gate dielectric material layer 22L. The work function metal layer 24L may be composed of a p-type work function metal or an n-type work function metal. In the case of a p-type device, the work function metal layer 24L should effectuate a p-type threshold voltage shift, i.e., a p-type work function metal is employed. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing material of the p-type semiconductor device. A "valence band" is the highest range of electron energies where electrons are normally present at absolute zero.

In one embodiment, the p-type work function metal may be composed of titanium and its nitride or carbide. In one specific embodiment, the p-type work function metal is composed of titanium nitride. The p-type work function metal may also be composed of titanium aluminum nitride, tantalum nitride, ruthenium, platinum, molybdenum, cobalt, and alloys and combinations thereof.

In an n-type device, the work function metal layer 24L should effectuate an n-type threshold voltage shift; i.e., an n-type work function metal is used. "N-type threshold voltage shift" as used herein means a shift in the Fermi energy of an n-type semiconductor device towards a conduction band of silicon in a silicon-containing material of the n-type semiconductor device. The "conduction band" is the lowest lying electron energy band of the doped material that is not completely filled with electrons. In one embodiment, the work function of the n-type work function metal ranges from 4.1 eV to 4.3 eV. In one embodiment, the n-type work function metal is composed of at least one of titanium aluminum, tantalum nitride, titanium nitride, hafnium nitride, hafnium silicon, or combinations thereof.

The work function metal layer 24L may be formed utilizing a deposition process such as, for example, chemical vapor deposition (CVD), plasma enhanced chemical vapor deposition (PECVD), physical vapor deposition (PVD), sputtering, or atomic layer deposition (ALD). In one embodiment of the present application, the work function metal that provides the work function metal layer 24L can have a thickness in a range from 1 nm to 10 nm. Other thicknesses that are lesser than, or greater than, the aforementioned thickness range can also be employed for the work function metal that provides the work function metal layer 24L. In some embodiments, the work function metal layer 24L has a conformal thickness.

Figure 5:
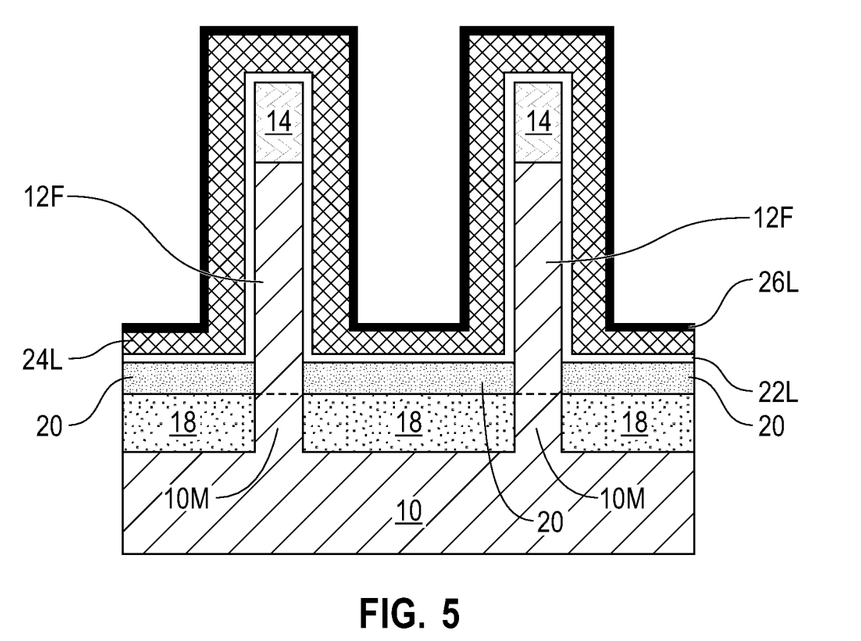
FIG. 5 is a cross sectional view of the exemplary vertical transistor of FIG. 4 after forming a sacrificial material layer on the work function metal layer.

Referring now to FIG. 5, there is illustrated the exemplary vertical transistor of FIG. 4 after forming a sacrificial material layer 26L on the work function metal layer 24L. The sacrificial material layer 26L is a continuous layer that is formed in the trench that is located between each dielectric hard mask capped semiconductor fin (14/12F) and atop each dielectric hard mask capped semiconductor fin (14/12F).

The sacrificial material layer 26L is composed of a dielectric material that compositionally different from at least the gate dielectric material layer 22L. In one example, the sacrificial material layer 26L is composed of silicon dioxide. The sacrificial material layer 26L may be formed utilizing a deposition process such as, for example, chemical vapor deposition (CVD), plasma enhanced chemical vapor deposition (PECVD), physical vapor deposition (PVD), sputtering, or atomic layer deposition (ALD). In one embodiment of the present application, the dielectric material that provides the sacrificial material layer 26L can have a thickness in a range from 1 nm to 5 nm. In some embodiments, the sacrificial material layer 26L has a conformal thickness.

Figure 6:
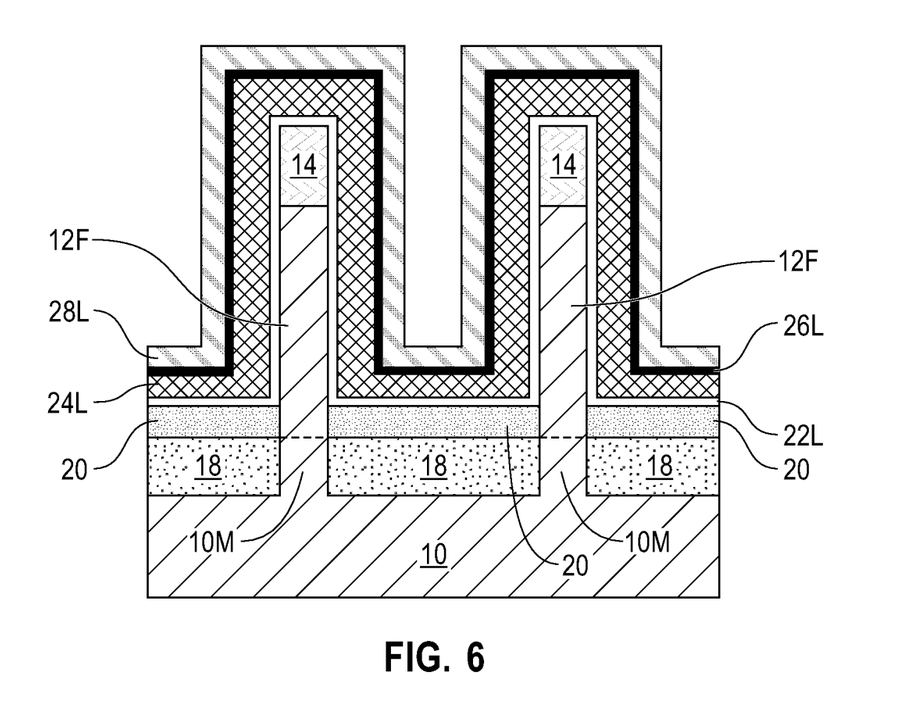
FIG. 6 is a cross sectional view of the exemplary vertical transistor of FIG. 5 after forming a passivation material layer on the sacrificial material layer.

Referring now to FIG. 6, there is illustrated the exemplary vertical transistor of FIG. 5 after forming a passivation material layer 28L on the sacrificial material layer 26L. The passivation material layer 28L is a continuous layer that is formed in the trench that is located between each dielectric hard mask capped semiconductor fin (14/12F) and atop each dielectric hard mask capped semiconductor fin (14/12F).

The passivation material layer 28L is composed of a dielectric material that compositionally different from the sacrificial material layer 26L and is capable of preventing air and/or moisture to egress into the gate structure. In one example, the passivation material layer 28L is composed of silicon nitride. The passivation material layer 28L may be formed utilizing a deposition process such as, for example, chemical vapor deposition (CVD), plasma enhanced chemical vapor deposition (PECVD), physical vapor deposition (PVD), sputtering, or atomic layer deposition (ALD). In one embodiment of the present application, the dielectric material that provides the passivation material layer 28L can have a thickness in a range from 1 nm to 10 nm. Other thicknesses that are lesser than, or greater than, the aforementioned thickness range can also be employed for the dielectric passivation material that provides the passivation material layer 28L. In some embodiments, the passivation material layer 28L has a conformal thickness.

Figure 7:
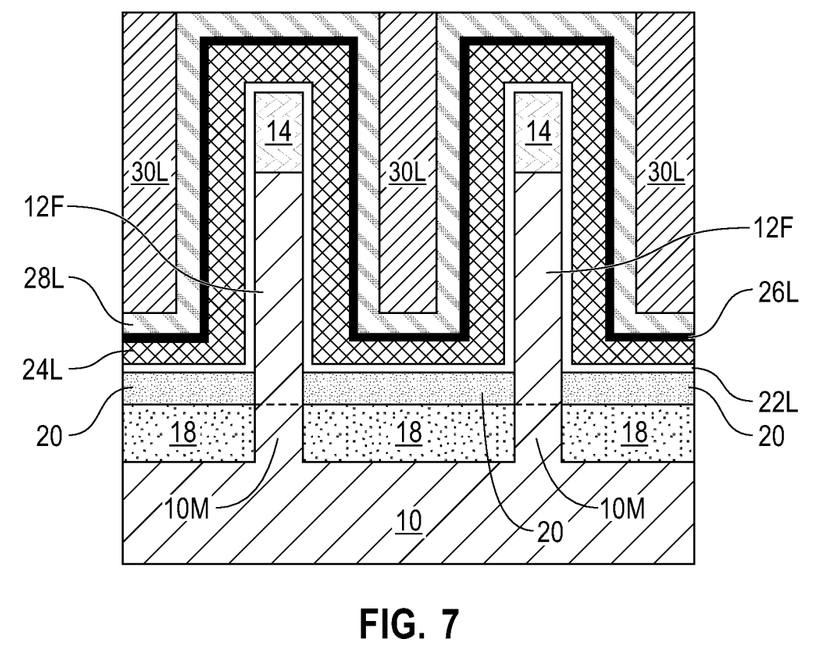
FIG. 7 is a cross sectional view of the exemplary vertical transistor of FIG. 6 after forming an interlayer dielectric material layer on the passivation material layer.

Referring now to FIG. 7, there is illustrated the exemplary vertical transistor of FIG. 6 after forming an interlayer dielectric (ILD) material layer 30L on the passivation material layer 28L. The ILD material layer 30L is located in the trench that is located between each dielectric hard mask capped semiconductor fin (14/12F) and, at this point of the present application, has a topmost surface that is substantially coplanar (i.e., within ±5%) with a topmost surface of the passivation material layer 28L.

The ILD material layer 30L is composed of a dielectric material that is compositionally different from the passivation material layer 28L. Exemplary dielectric material that may be used as the ILD material layer 30L include silicon dioxide, undoped silicate glass (USG), fluorosilicate glass (FSG), borophosphosilicate glass (BPSG), a spin-on low k dielectric layer, a chemical vapor deposition (CVD) low-k dielectric layer or any combination thereof. In another embodiment, a self-planarizing material such as a spin-on glass (SOG) or a spin-on low-k dielectric material such as SiLK™ can be used as the ILD material layer 30L. In one embodiment, ILD material layer 30L can be formed utilizing a deposition process including, for example, chemical vapor deposition (CVD), plasma enhanced chemical vapor deposition (PECVD), evaporation or spin-on coating. Following deposition of the ILD material layer 30L, a planarization process such as, for example, chemical mechanical polishing (CMP), can employed.

Figure 8:
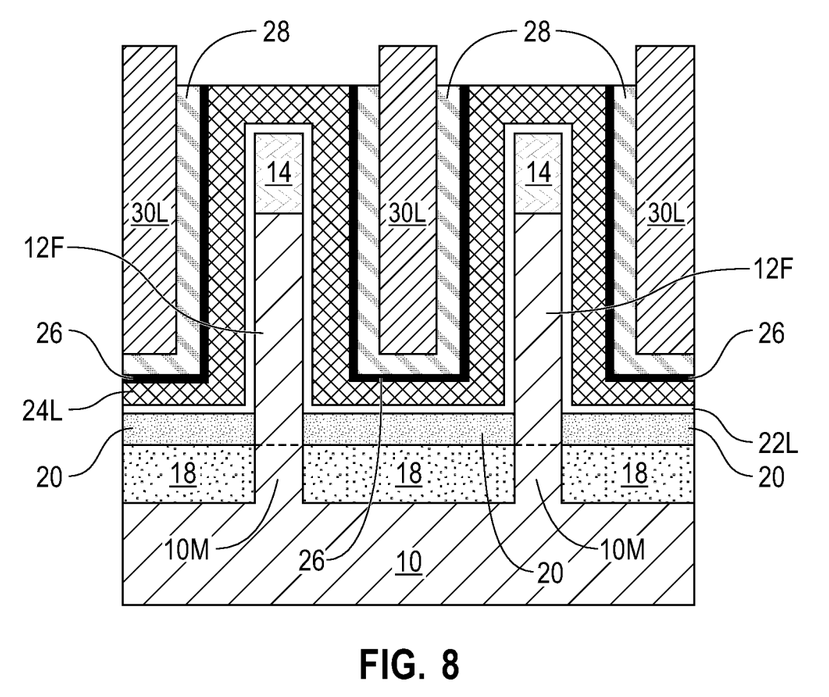
FIG. 8 is a cross sectional view of the exemplary vertical transistor of FIG. 7 after removing a horizontal portion of each of the passivation material layer and the sacrificial material layer located above each dielectric hard mask capped semiconductor fin to physically expose a horizontal surface of the work function metal layer.

Referring now to FIG. 8, there is illustrated the exemplary vertical transistor of FIG. 7 after removing a horizontal portion of each of the passivation material layer 28L and the sacrificial material layer 26L located above each dielectric hard mask capped semiconductor fin (14/12F) to physically expose a horizontal surface of the work function metal layer 24L. The horizontal portion of the passivation material layer 28L can be removed utilizing a first selective etching process, while the horizontal portion of the sacrificial material layer 26L can be removed utilizing a second selective etching process that is different from the first etching process.

After removing the horizontal portion of each of the passivation material layer 28L and the sacrificial material layer 26L located above each dielectric hard mask capped semiconductor fin (14/12F), a portion of the passivation material layer 28L remains in each of the trenches that is located between the dielectric hard masked capped semiconductor fins (14/12F), and a portion of the portion of the sacrificial material layer 26L remains in each of the trenches that is located between the dielectric hard masked capped semiconductor fins (14/12F). Each remaining portion of the passivation material layer 28L may be referred to herein as a passivation material liner 28, while each remaining portion of the sacrificial material layer 26L may be referred to herein as a sacrificial material layer portion 26.

At this point of the present application, each passivation material liner 28 has a topmost surface that is substantially coplanar (i.e., within ±5%) with a topmost surface of each sacrificial material layer portion 26 as well as the physically exposed topmost horizontal surface of the work function metal layer 24L.

Figure 9:
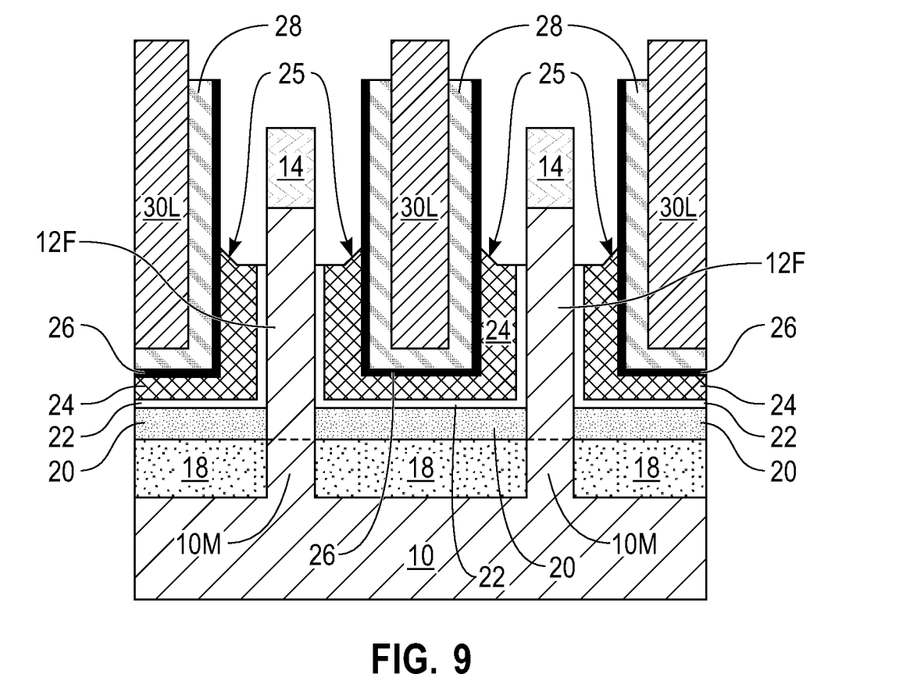
FIG. 9 is a cross sectional view of the exemplary vertical transistor of FIG. 8 after recessing the work function metal layer to provide a work function metal liner having a winged surface, and thereafter recessing the gate dielectric material layer to provide a gate dielectric material liner.

Referring now to FIG. 9, there is illustrated the exemplary vertical transistor of FIG. 8 after recessing the work function metal layer 24L to provide a work function metal liner 24 having a winged surface 25, and thereafter recessing the gate dielectric material layer 22L to provide a gate dielectric material liner 22. As is shown, the wing surface 25 of each of the work function metal liners 24 extends above the topmost surface of the gate dielectric material liner 22. Thus, at this point of the present application the work function metal liner 24 has a non-planar topmost surface with a portion that protrudes above a laterally adjacent portion.

The recessing of the work function metal layer 24L may be performed utilizing a vertical wet etching process that is selective in removing the work function metal material that provides the work function metal layer 24L. In one example, hydrogen peroxide can be used as the wet etchant to selectively the work function metal material that provides the work function metal layer 24L.

The recessing of the gate dielectric material layer 22L may be performed utilizing a wet etching process that is selective in removing the dielectric material that provides the gate dielectric material layer 22L. In one example, HCl can be used as the wet etchant to selectively the dielectric material that provides the gate dielectric material layer 22L.

Figure 10:
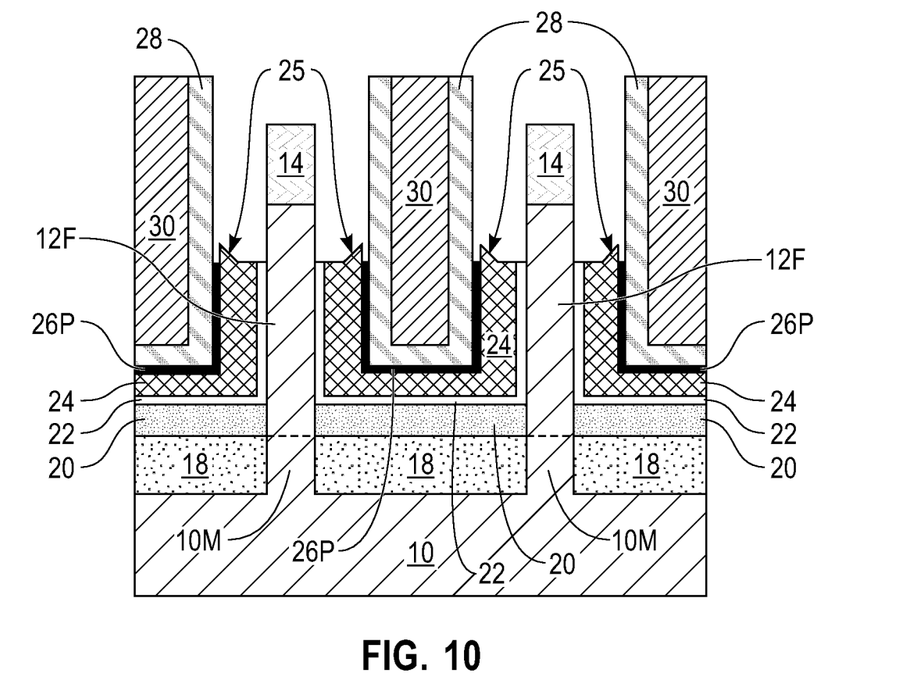
FIG. 10 is a cross sectional view of the exemplary vertical transistor of FIG. 9 after recessing the remaining sacrificial material layer to provide a sacrificial material liner.

Referring now to FIG. 10, there is illustrated the exemplary vertical transistor of FIG. 9 after recessing the remaining sacrificial material layer (i.e., the sacrificial material layer portion 26) to provide a sacrificial material liner 26P. The sacrificial material liner 26P is located in each trench that is located between the dielectric hard mask capped semiconductor fins (14/12F). The sacrificial material liner 26P has a topmost surface that is substantially coplanar (i.e., within ±5%) with the topmost surface of the gate dielectric material liner 22.

The recessing of the sacrificial material layer portion 26 physically exposes a sidewall of the wing surface 25 of the work function metal liner 24. This allows for multi-directional etching of the wing surface 25 of the work function metal liner 24.

The recessing of the sacrificial material layer portion 26 may be performed utilizing an etching process that is selective in removing the dielectric material that provides the sacrificial material layer portion 26. In one example, hydrofluoric acid or a buffer oxide etch (i.e., a mixture of ammonium fluoride and hydrofluoric acid) can be used as the etchant to selectively the dielectric material that provides the sacrificial material layer portion 26.

In some embodiments, and during the recessing of the sacrificial material layer portion 26, the ILD material layer 30L may be recessed as well. In other embodiments, a separate material removal process can be used to recess the ILD material layer. The recessed ILD material layer is referred to herein as an ILD material 30. The ILD material 30 laterally surrounds each dielectric hard mask capped semiconductor fin (14/12F) and has a topmost surface that is substantially coplanar (i.e., within ±5%) with a topmost surface of the passivation material liner 28.

Figure 11:
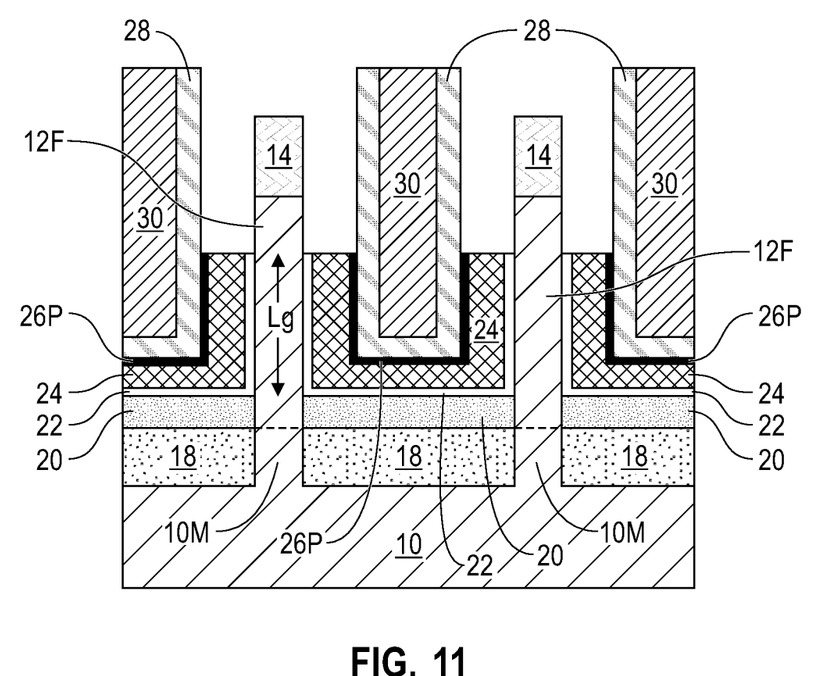
FIG. 11 is a cross sectional view of the exemplary vertical transistor of FIG. 10 after removing the winged surface of the work function metal liner.

Referring now to FIG. 11, there is illustrated the exemplary vertical transistor of FIG. 10 after removing the winged surface 25 of the work function metal liner 24. After winged surface 25 removal, the work function metal liner is wing-free and the wing-free work function metal liner 24' has a topmost surface that is substantially coplanar (i.e., within ±5%) with a topmost surface of each of the sacrificial material liner 26P and the gate dielectric material liner 22. A uniform gate length, Lg, is provided as well as a gate structure that lacks a winged work function metal material. The wing-free work function metal liner 24' has a uniform and flat topmost surface.

The removal of the winged surface 25 of the work function metal liner 24 is performed utilizing a multi-directional (from the top and side) etch. In one embodiment, the multi-directional etch includes an isotropic wet etching. In one example, the isotropic wet etch includes a mixed chemical solution of $NH_4OH$, $H_2O_2$ and $H_2O$ (such a mixture is referred to as "SC1").

As is shown in FIG. 11, the sacrificial material liner 26P, the wing-free work function metal liner 24', and the gate dielectric material liner 26P are U-shaped between each neighboring pair of dielectric hard mask capped semiconductor fins (14/12F). Also, and as is shown, an upper portion of the sidewall of each semiconductor fin 12F is now physically exposed.

Figure 12:
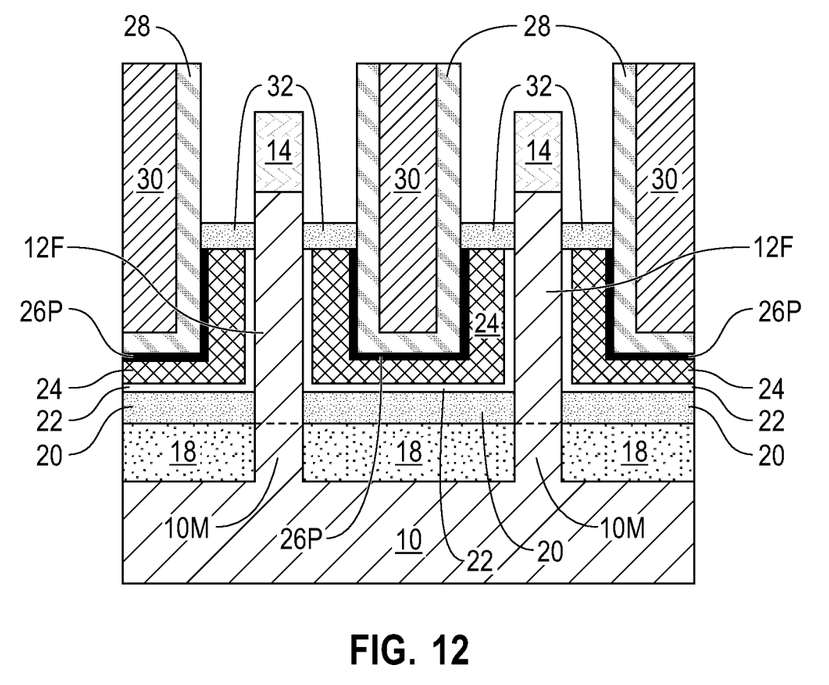
FIG. 12 is a cross sectional view of the exemplary vertical transistor of FIG. 11 after forming a top spacer.

Referring now to FIG. 12, there is illustrated the exemplary vertical transistor of FIG. 11 after forming a top spacer 32. The top spacer 32 is formed upon the sacrificial material liner 26P, the wing-free work function metal liner 24', and the gate dielectric material liner 22. Top spacer 32 may include one of the materials mentioned above for the bottom spacer 20; the top spacer 32 is composed of a different dielectric material than the dielectric hard masks 14. The top spacer 32 may be formed utilizing one of the deposition processes mentioned above in forming the bottom spacer 20. The top spacer 32 may have a thickness within the thickness range mentioned above for the bottom spacer 20. The top spacer 32 has a sidewall that directly contacts the upper portion of the physically exposed semiconductor fin 12F sidewall.

Figure 13:
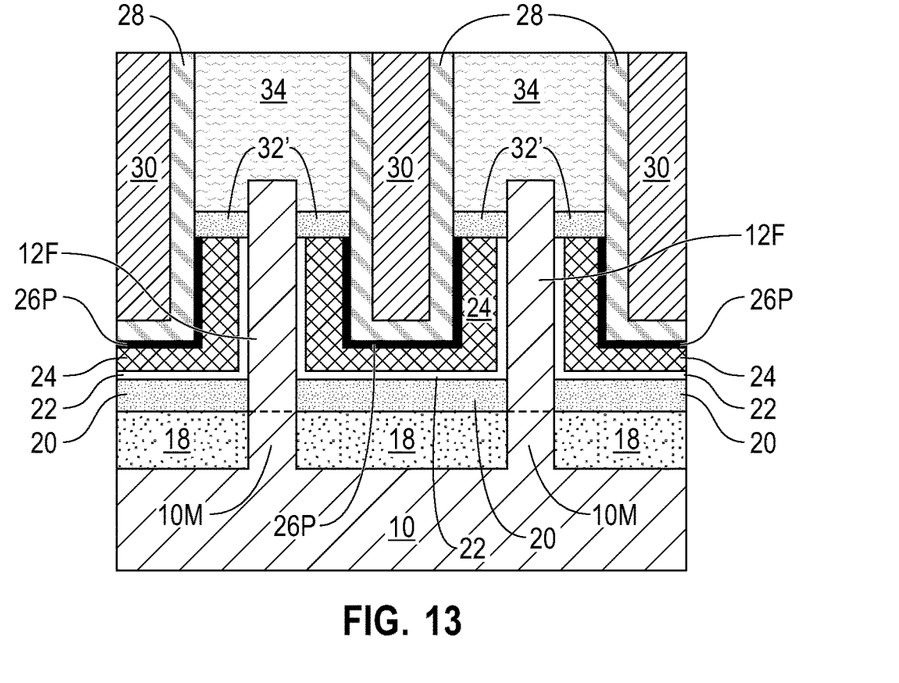
FIG. 13 is a cross sectional view of the exemplary vertical transistor of FIG. 12 after forming a top source/drain structure.

Referring now to FIG. 13, there is illustrated the exemplary vertical transistor of FIG. 12 after forming a top source/drain structure 34. Prior to top source/drain structure 34 formation, each dielectric hard mask 14 is removed so as to expose a topmost surface of each semiconductor fin 12F. As such, the top source/drain structure 34 is formed upon a remaining upper portion of the physically exposed semiconductor fin 12F sidewall as well as the physically exposed topmost surface of one of the semiconductor fins 12F.

Each hard mask 14 can be removed utilizing a material removal process such as, for example, etching or planarization. The removal of each hard mask 14 physically exposes a topmost surface of each semiconductor fin 12F. Next, the top source/drain structure 34 can be formed utilizing an epitaxial growth (or deposition) process, as defined above. In accordance with the present application, the top source/drain structure 34 includes a semiconductor material and either an n-type or p-type dopant. The semiconductor material that provides the top source/drain structure 34 may be the same or different from the semiconductor material of semiconductor substrate 10 and/or the semiconductor fins 12F. The concentration of dopant within the semiconductor material that provides the top source/drain structure 34 can range from $1\times10^{18}$ atoms/$cm^3$ to $1\times10^{21}$ atoms/$cm^3$, although dopant concentrations greater than $1\times10^{21}$ atoms/$cm^3$ or less than $1\times10^{18}$ atoms/$cm^3$ are also conceived. The top source/drain structure 34 may have a topmost surface that is substantially coplanar (i.e., within ±5%) with a topmost surface of the ILD material 30 and the passivation material liner 28.

Notably, FIG. 13 illustrates an exemplary vertical transistor of the present application. The exemplary vertical transistor includes a semiconductor fin 12F located on a mesa portion 10M of a semiconductor substrate 10. A bottom source/drain structure 18 contacts a sidewall of the mesa portion 10M of the semiconductor structure 10M. A gate structure is located adjacent to a sidewall of the semiconductor fin 12 and spaced apart from the bottom source/drain structure 18. The gate structure includes a gate dielectric material liner 22 and a wing-free work function metal liner 24'. A sacrificial material liner 26P is located on the wing-free work function metal liner 24'. A top source/drain structure 34 is spaced apart from the gate structure and contacts an upper portion of the sidewall of semiconductor fin 12F and a topmost surface of the semiconductor fin 12F. In the exemplary vertical transistor of the present application, the absence of a winged surface work function metal liner at the channel end (and fin end in the other direction) substantially eliminates an electrical short between the top source/drain structure 34 and the gate structure (22, 24').

Figure 14:
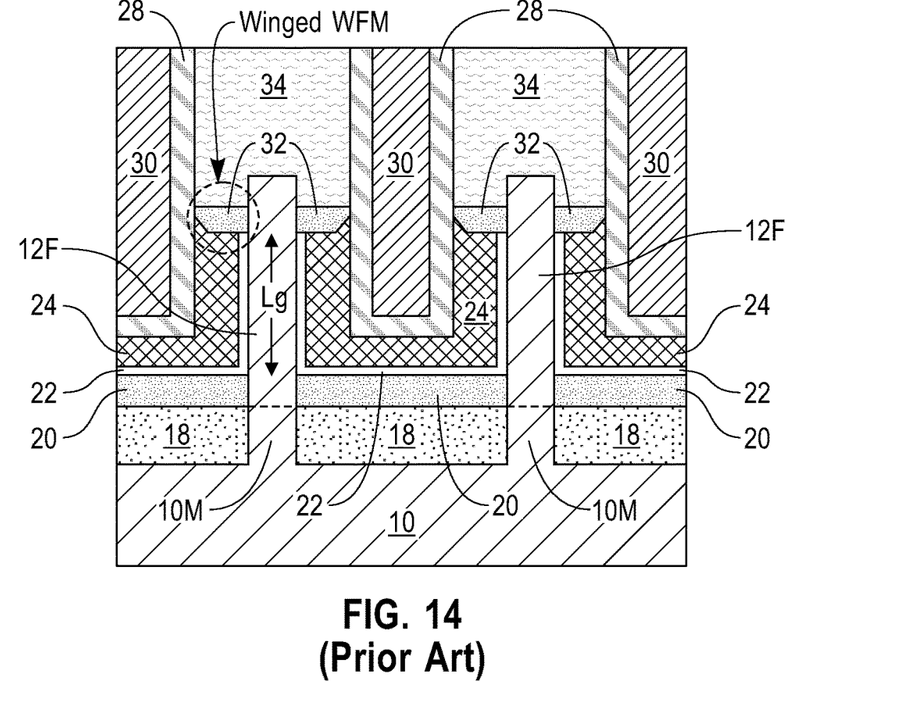
FIG. 14 is a cross sectional view of a prior art vertical transistor including a work function metal liner having a winged surface.

Referring now to FIG. 14, there is illustrated a prior art vertical transistor including a work function metal liner 34 having a winged surface (Winged WFM). In FIG. 14, like elements as shown in FIG. 13 have like reference numerals. The prior art vertical transistor including the work function metal liner 24 having the winged surface (Winged WFM) is formed utilizing the same basic processing steps as the present application except for the omission of the sacrificial material liner 26P and the multi-directional etch. The presence of the winged surface work function metal liner 34 at the channel end (and fin end in the other direction) causes an electrical short between the top source/drain structure 34 and the gate structure (22, 24).

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A vertical transistor comprising:
  a semiconductor fin located on a mesa portion of a semiconductor substrate;
  a bottom source/drain structure extending from a sidewall of the mesa portion of the semiconductor structure;
  a gate structure located adjacent to a sidewall of the semiconductor fin and spaced apart from the bottom source/drain structure, the gate structure comprising a gate dielectric material liner and a wing-free work function metal liner;
  a sacrificial material liner located on the wing-free work function metal liner; and
  a top source/drain structure spaced apart from the gate structure and contacting an upper portion of the sidewall of semiconductor fin and a topmost surface of the semiconductor fin.

2. The vertical transistor of claim 1, further comprising a bottom spacer located between the bottom source/drain structure and the gate structure and contacting a lower portion of the sidewall of the semiconductor fin.

3. The vertical transistor of claim 2, further comprising a top spacer located between the top source/drain structure and the gate structure and contacting a portion of the sidewall of the semiconductor fin.

4. The vertical transistor of claim 1, wherein the sacrificial material liner has a topmost surface that is substantially coplanar with a topmost surface of each of the wing-free work function metal liner and the gate dielectric material liner.

5. The vertical transistor of claim 1, further comprising a passivation material liner and an interlayer dielectric material laterally surrounding gate structure and the least one semiconductor fin.

6. The vertical transistor of claim 5, wherein the passivation material liner has a topmost surface that is substantially coplanar with a topmost surface of the interlayer dielectric material.

7. The vertical transistor of claim 6, wherein the topmost surface of each of the passivation material liner and the interlayer dielectric material is substantially coplanar with a topmost surface of the top source/drain structure.

8. The vertical transistor of claim 1, wherein the wing-free work function metal liner is composed of a p-type work function metal.

9. The vertical transistor of claim 1, wherein the wing-free work function metal liner is composed of an n-type work function metal.

10. The vertical transistor of claim 1, wherein the gate dielectric material liner has a dielectric constant of greater than 4.0.

11. A method of forming a vertical transistor, the method comprising:
    forming a semiconductor fin on a mesa portion of a semiconductor substrate, wherein a bottom source/drain structure extends from a sidewall of the mesa portion of the semiconductor structure and a bottom spacer is located on the bottom source/drain structure and contacting a lower portion of a sidewall of the semiconductor fin;
    forming a gate stack on the bottom spacer and laterally adjacent to and above the semiconductor fin, wherein the gate stack includes a gate dielectric material layer and a work function metal layer;
    forming a sacrificial material layer on the work function metal layer;
    forming a passivation material layer on the sacrificial material layer;
    removing a horizontal portion of each of the passivation material layer and the sacrificial material layer located above the semiconductor fin to physically expose a horizontal surface of the work function metal layer;
    recessing the work function metal layer to provide a work function metal liner having a winged surface;
    recessing the gate dielectric material layer to provide a gate dielectric material liner;
    recessing a remaining portion of the sacrificial material layer to provide a sacrificial material liner;
    removing the winged surface of the work function metal liner to provide a wing-free work function metal liner;
    forming a top spacer on a topmost surface of each of the gate dielectric material liner, the wing-free work function metal liner, and the sacrificial material liner; and
    forming a top source/drain structure on the top spacer and contacting an upper portion of the sidewall of the semiconductor fin and a topmost surface of the semiconductor fin.

12. The method of claim 11, wherein the mesa portion of the semiconductor substrate is formed by forming a bottom source/drain trench into physically exposed portions of the semiconductor substrate not including the semiconductor fin.

13. The method of claim 12, wherein the bottom source/drain structure is formed by forming a doped semiconductor material in the source/drain trench.

14. The method of claim 11, wherein the semiconductor fin is capped with a dielectric hard mask cap, and the dielectric hard mask cap is removed from the semiconductor fin after the formation of the top spacer and prior to the forming of the top source/drain structure.

15. The method of claim 11, further comprising forming an interlayer dielectric material layer on the passivation material layer that is located laterally adjacent to the semiconductor fin, wherein the interlayer dielectric material layer has topmost surface that is substantially coplanar with a topmost surface of the passivation material layer that is located above the semiconductor fin.

16. The method of claim 11, wherein the moving of the winged surface of the work function metal liner comprises a multi-directional etch.

17. The method of claim 11, wherein the sacrificial material liner has a topmost surface that is substantially coplanar with a topmost surface of each of the wing-free work function metal liner and the gate dielectric material liner.

18. The method of claim 11, wherein the work function metal layer is composed of a p-type work function metal.

19. The method of claim 11, wherein the work function metal layer is composed of an n-type work function metal.

20. The method of claim 11, wherein the forming of the top source/drain structure comprising an epitaxial growth process.

* * * * *